United States Patent [19]

Wrezel et al.

[11] Patent Number: 4,777,227

[45] Date of Patent: Oct. 11, 1988

[54] HIGH TEMPERATURE THERMOSETTING RESIN COMPOSITIONS

[75] Inventors: James A. Wrezel, Buffalo Grove; Allyson J. Beuhler, Indian Head Park, both of Ill.

[73] Assignee: Allied Corporation, Morris Township, Morris County, N.J.

[21] Appl. No.: 42,928

[22] Filed: Apr. 27, 1987

Related U.S. Application Data

[63] Continuation-in-part of Ser. No. 800,244, Nov. 21, 1985, abandoned.

[51] Int. Cl.$^4$ ............... C08L 25/08; C08L 25/14; C08L 35/00; C08L 45/00
[52] U.S. Cl. .............................. 525/207; 525/208; 525/210
[58] Field of Search ................. 525/207, 208, 210

[56] References Cited

U.S. PATENT DOCUMENTS 2,510,647 6/1950 Miller et al. ............... 260/33.2
3,852,236 12/1974 Heilman ..................... 260/42.18
3,888,943 6/1975 Labana et al. ............... 260/836

Primary Examiner—Carman J. Seccuro
Attorney, Agent, or Firm—Raymond H. Nelson; Harold N. Wells; Jay P. Friedenson

[57] ABSTRACT

High temperature thermosetting resin compositions which may be used as a polymer matrix for a printed circuit board will comprise a terpolymer of an ethylenically monosubstituted unsaturated monomer in which said substituent is an aromatic moiety such as styrene, an ethylenically alpha,beta-disubstituted unsaturated monomer in which each substituent is an aromatic or benzylic moiety such as acenaphthylene and a glycidyl ester of a monoethylenically unsaturated acid such as glycidyl methacrylate cross-linked with a copolymer of an anhydride of a dibasic olefinic acid such as maleic anhydride and an ethylenically monosubstituted unsaturated monomer in which said substituent is an aromatic moiety such as styrene.

29 Claims, No Drawings

HIGH TEMPERATURE THERMOSETTING RESIN COMPOSITIONS

CROSS REFERENCE TO RELATED APPLICATIONS

This application is a continuation-in-part of our co-pending application Ser. No. 800,244 filed Nov. 21, 1985, now abandoned.

BACKGROUND OF THE INVENTION

With the advent of sophisticated equipment in the electrical and electronic fields, it has become necessary that the components of the various pieces of equipment conform to high standards which are set forth in the specifications for these components. For example, circuit boards which are used in relatively complicated pieces of equipment such as main frame computers must be of a relatively high standard of quality in order to function in an efficient manner for a long period of time without deteriorating or breaking down and thus causing an interruption in the function of the machine. This high quality of material is opposed to pieces of equipment requiring a lower standard of quality such as those used in personal computers, television equipment, radios, etc.

Circuit boards upon which a circuit is etched or implanted usually comprise a laminate which is composed of a synthetic polymeric substance and a suitable reinforcement matrix, the composite of which possesses desirable characteristics such as rigidity, low thermal expansion, dimensional stability, low dielectric constant, etc. As will hereinafter be shown, it has now been discovered that a high temperature thermosetting resin composition comprised of one polymer consisting of a three-component polymer and a second polymer comprising a two-component polymer may be cured and used as a circuit board matrix material which will possess the desirable characteristics hereinbefore set forth.

Some previous United States patents have described thermosettable or powder coating compositions. However, these compositions differ from the high temperature thermosetting resin composition of the present invention. For example, U.S. Pat. No. 3,852,236 describes a composition comprising a polyanhydride dissolved in a olefinic monomer such as styrene plus the addition of glycidyl methacrylate or other additives, following which the polymerization of the composition occurs to form a solid infusible resin. In contrast to the teachings found in this patent, the polymeric system of the present invention does not have any volatile olefinic monomers present in the system either during or after curing; the composition of the present invention comprising essentially a polymer blend before curing which, after curing, results in the obtention of a nearly 100% solids system. The system of the present invention incorporates an improved multifunctional terpolymer resin which, upon cross-linking and curing, provides a resin composition which possesses improved properties which are desirable for high speed, high performance circuit boards. As will be hereinafter shown in greater detail in the examples, these properties will include high glass transition temperature, low thermal expansivity and low dielectric constants, these desirable properties not being shown in this patent.

Another U.S. Pat. No. 3,888,943 describes formulations comprising polyanhydrides which are reacted and cured with epoxy-functional polymers. Again, the resin compositions of the present invention which are utilized for printed wiring board applications will exhibit improved properties of the materials of this patent in that the epoxy-functional polymer of the present invention possesses structural groups which will impart the aforementioned desirable properties of high glass transition, low thermal expansion and low dielectric constants. This is in contrast to those which are recited in the patent; for example, the epoxy materials of the patent will possess glass transition temperatures of between 40° and 90° C. While these glass transitions are suitable for powder or powder coatings they are not suitable for use in printed wiring board applications. In contradistinction to these relatively low glass transitions of the patent, the epoxy terpolymer resin compositions of the present invention will possess glass transitions of at least 140° C. In addition, another difference between the patent and the instant application is that the former powder coating composition will have considerable quantities of acrylate and/or methacrylate groups present which would provide undesirable high dielectric constants. Furthermore, the patent also teaches that there is a flow control agent or plasticizer present in the composition. To reiterate and further illustrate the differences between the patent and the present invention, the former discloses the use of a polyanhydride which also contains methacrylate backbone structures, that is groups imparting low glass transitions and high dielectric constants to the finished product, whereas in contrast, the present application requires a high concentration of non-polar rigid groups present in the polyanhydrides to impart the desired characteristics or properties of low dielectric constants and high glass transitions in the final resin composition.

U.S. Pat. No. 2,510,647 discloses a polymeric acenaphthylene or copolymers of acenaphthylene with compounds containing at least one polymerizable ethylene group such as various vinyl compounds as exemplified by methacrylic acid esters or aryl compounds such as styrene. It is noted that each of the references discloses only copolymers rather than the terpolymer composition which will hereinafter be disclosed in greater detail.

BRIEF SUMMARY OF THE INVENTION

This invention relates to high temperature thermosetting resin compositions. More specifically, the invention is concerned with such a polymer and to a method for the preparation thereof. As was previously mentioned, the resin compositions of the present invention which constitute novel compositions of matter may be utilized as polymer matrices in circuit board laminates and dielectric coatings, the use thereof being attributable to the desirable characteristics which are possessed by these polymeric compositions of matter.

It is therefore an object of this invention to provide a novel high temperature thermosetting resin composition.

Another object of this invention resides in a process for preparing the aforementioned high temperature thermosetting resin composition.

In one aspect, an embodiment of this invention resides in a high temperature thermosetting resin composition which comprises a terpolymer consisting of (1) an ethylenically monosubstituted unsaturated monomer in which said substituent is an aromatic moiety, (2) an ethylenically alpha,beta-disubstituted unsaturated monomer in which each substituent is an aromatic or benzylic moiety, and (3) a glycidyl ester of a monoethylenically unsaturated acid, said terpolymer being cross-linked with a cross-linking agent comprising a copolymer of (a) an anhydride of a dibasic olefinic acid and (b) ethylenically monosubstituted unsaturated monomer in which said substituent is an aromatic moiety or an ethylenically alpha,beta-disubstituted unsaturated monomer in which each substituent is an aromatic or benzylic moiety.

Another embodiment of this invention is found in a process for the preparation of a high temperature thermosetting resin composition which comprises admixing (1) an ethylenically monosubstituted unsaturated monomer in which said substituent is an aromatic moiety, (2) an ethylenically alpha,beta-disubstituted unsaturated monomer in which each substituent is an aromatic or benzylic moiety, and (3) a glycidyl ester of a monoethylenically unsaturated acid, adding the resultant terpolymer admixture to the copolymer formed by admixing (a) an anhydride of a dibasic olefinic acid and (b) ethylenically monosubstituted unsaturated monomer in which said substituent is an aromatic moiety or an ethylenically alpha,beta-disubstituted unsaturated monomer in which each substituent is an aromatic or benzylic moiety at admixing conditions, cross-linking the terpolymer admixture and copolymer, curing the cross-linked product at curing conditions, and recovering the resultant high temperature thermosetting resin composition.

A specific embodiment of this invention resides in a high temperature thermosetting resin composition comprising a terpolymer mixture of styrene, acenaphthylene and glycidyl methacrylate which has been cross-linked with an agent comprising a copolymer of styrene and maleic anhydride.

Another specific embodiment of this invention resides in a process for the preparation of a high temperature thermosetting resin composition which comprises admixing styrene, acenaphthylene and glycidyl methacrylate at a temperature in the range of from about ambient to about 100° C. at atmospheric or subatmospheric pressure to form a terpolymer, adding the resultant recovered admixture to a recovered copolymer which has been formed by admixing styrene and maleic anhydride at a temperature in the range of from about ambient to about 100° C. and at atmospheric or subatmospheric pressure, cross-linking the terpolymer and copolymer in the presence of a catalyst comprising benzyldimethylamine, and a solvent system such as N,N-dimethylformamide, toluene, N-methylpyrrollidinone, or mixtures thereof at a temperature in the range of from about 150° to about 250° C. for a period of time ranging from about 1 to about 40 hours, and recovering the resultant high temperature thermosetting resin composition.

Other objects and embodiments will be found in the following detailed description of the invention.

DETAILED DESCRIPTION OF THE INVENTION

As hereinbefore set forth, the present invention is concerned with novel high temperature thermosetting resin compositions as well as to a method for preparing these compounds. The resin composition will comprise a terpolymer formed from a mixture of an ethylenically monosubstituted unsaturated monomer in which said substituent is an aromatic moiety, an ethylenically alpha,beta-disubstituted unsaturated monomer in which each substituent is an aromatic or benzylic moiety, and a glycidyl ester of a monoethylenically unsaturated acid, said terpolymer having been cross-linked by treatment with a cross-linking agent comprising a copolymer formed from an anhydride of a dibasic olefinic acid and an ethylenically monosubstituted unsaturated monomer in which said substituent is an aromatic moiety or an ethylenically alpha, beta-disubstituted unsaturated monomer in which each substituent is an aromatic or benzylic moiety. By utilizing such a cross-linking agent which is incorporated in a high molecular weight compound, it is possible to obtain a solid composition of matter which is useful in electronic circuitry, said solid composite possessing a relatively low dielectric constant and high thermal stability.

Some examples of an ethylenically monosubstituted unsaturated monomer in which said substituent is an aromatic moiety which may be employed as one component of the terpolymer which comprises one polymer of the composition of matter of the present invention will include styrene, halo-substituted styrenes such as o-chlorostyrene, m-chlorostyrene, p-chlorostyrene, o-bromostyrene, m-bromostyrene, p-bromostyrene, o-iodostyrene, m-iodostyrene, p-iodostyrene, 4-methylstyrene, vinyl naphthalene, 4-vinylbiphenyl, etc. In the preferred embodiment of the invention the second component of the terpolymer comprises an ethylenically alpha,beta-disubstituted unsaturated monomer in which each substituent is an aromatic or benzylic moiety such as acenaphthylene, indene, etc. The third component of the terpolymer will comprise a glycidyl ester of a monoethylenically unsaturated acid which, again in the preferred embodiment of the invention, comprises glycidyl acrylate, glycidyl methacrylate, glycidyl crotonate, glycidyl tiglate, etc. It is to be understood that the aforementioned an ethylenically monosubstituted unsaturated monomer in which said substituent is an aromatic moiety, an ethylenically alpha,beta-disubstituted unsaturated monomer in which each substituent is an aromatic or benzylic moiety, and a glycidyl ester of a monoethylenically unsaturated acid are only representative of the class of compounds which may be employed to form the desired novel terpolymer, and that the present invention is not necessarily limited thereto.

The cross-linking agent which is employed to form the desired resin composition of the present invention may be designated as a second polymer of the network. This copolymer is formed from the anhydride of a dibasic olefinic agent and an ethylenically monosubstituted unsaturated monomer in which said substituent is an aromatic moiety, or an ethylenically alpha,beta-disubstituted unsaturated monomer in which each substituent is an aromatic or benzylic moiety. In the preferred embodiment of the invention, the anhydride of the dibasic olefinic acid will comprise maleic anhydride, although it is also contemplated within the scope of this invention that other anhydrides of isomeric dibasic olefinic acids such as glutaconic anhydride, citraconic anhydride, allylmalonic anhydride, allylsuccinic anhydride, etc. may also be employed although not necessarily with equivalent results. The ethylenically monosubstituted unsaturated monomer in which said substituent is an aromatic moiety or an ethylenically alpha,beta-disubstituted unsaturated monomer in which each substituent is an aromatic or benzylic moiety which comprises the second component of the copolymer will be selected from those previously set forth such as styrene, o- chlorostyrene, m-bromostyrene, p-bromostyrene, o-iodostyrene, p-iodostyrene, vinylnaphthalene, 1,2-dihydronaphthalene, acenaphthylene, indene, etc.

The desired and novel high temperature thermosetting resin composition may be prepared in any suitable manner of operation including both a continuous and a batch-type operation. For example, when a batch-type operation is employed, the desired three components of the terpolymer comprising, as hereinbefore set forth, an ethylenically monosubstituted unsaturated monomer in which said substituent is an aromatic moiety, an ethylenically alpha,beta-disubstituted unsaturated monomer in which each substituent is an aromatic or benzylic moiety and a glycidyl ester of a monoethylenically unsaturated acid, are placed in an appropriate apparatus along with a solvent and a free radical initiator such as azobisisobutyronitrile, benzoyl peroxide, etc. Those skilled in the art will recognize that the final composition of matter is dependant on the monomer feed ratio and is thus related to the reactivity ratios of the respective monomers at admixing conditions. For continuous operation, product quality and consistency are achieved only through proper balance of monomer concentration during the course of the operation. The three components of the mixture may be present in the reaction mixture in an amount of from about 20 to about 75 mole percent of an ethylenically monosubstituted unsaturated monomer in which said substituent is an aromatic moiety, from about 20 to about 75 mole percent of an ethylenically alpha,beta-disubstituted unsaturated monomer in which each substituent is an aromatic or benzylic moiety, and from about 5 to about 30 mole percent of the a glycidyl ester of a monoethylenically unsaturated acid. After admixing the three components of the mixture at mixing conditions which, in the preferred embodiment of the invention, comprise temperatures ranging from ambient (20°–25°C.) to about 100° C. and subatmospheric pressures ranging from about 1 to about 10 mm Hg or atmospheric pressure with inert gas flow, the resulting terpolymer is recovered as a solid product, then cross-linked by the addition of a cross-linking agent comprising a copolymer of an anhydride of a dibasic olefinic acid and an ethylenically monosubstituted unsaturated monomer in which said substituent is an aromatic moiety, or an ethylenically alpha,beta-disubstituted unsaturated monomer in which each substituent is an aromatic or benzylic moiety, of the type hereinbefore set forth in the presence of a catalyst such as a Lewis base including benzyldimethylamine, 2-methylimidazole, benzyldiethylamine, benzyldipropylamine, methyldibenzylamine, ethyldibenzylamine, etc. and in the presence of a solvent system including N,N-dimethylformamide, toluene, N-methylpyrollidinone, etc. or mixtures thereof. Some examples of these cross-linking agents which may be employed will include copolymers of styrene and maleic anhydride, p-bromostyrene and maleic anhydride, o-chlorostyrene and maleic anhydride, o-iodostyrene and maleic anhydride, vinyl naphthalene and maleic anhydride, acenaphthylene and maleic anhydride, indene and maleic anhydride, etc. It is to be understood that the aforementioned copolymers are only representative of the second polymer present in the high temperature thermosetting resin composition, and that the present invention is not necessarily limited thereto.

After mixing the terpolymer with the copolymer cross-linking agent, catalyst, and solvent(s), the mixture is then subjected to cure utilizing a graduated curing cycle to fully react the material and remove essentially all the solvent. The curing conditions which are employed will include temperatures ranging from about 150° to about 350° C. for a period of time which may range from about 1 to about 40 hours or more in duration. For example, the polymer may be cured at a temperature in the lower end of the range such as, for example, 150° C. for a relatively long period of time such as 14 to 24 hours, a shorter period of time at a higher temperature followed by a still shorter period of time at a temperature in the higher portion of the hereinbefore set forth range. At the end of the predetermined cure period, the resin composition is then recovered for use in dielectric coatings or as a laminate material in a circuit board. The amount of catalyst used during cure can be varied to control the pot life and processing characteristics of the mixture.

It is also contemplated within the scope of this invention that the resin composition may be prepared in a continuous manner of operation. When this type of operation is used, the predetermined amounts of the terpolymer are continuously charged to a reaction zone which is maintained at the proper operating conditions of temperature and pressure along with a solvent and catalyst. Other predetermined amounts of copolymer formed from the anhydride of a dibasic olefinic acid and an ethylenically monosubstituted unsaturated monomer in which said substituent is an aromatic moiety, or an ethylenically alpha,beta-disubstituted unsaturated monomer in which each substituent is an aromatic or benzylic moiety, are also continuously charged to the reaction zone through a separate line or, if so desired, terpolymer and copolymer cross-linking agent may be charged to the reaction zone in a single stream. In addition, other components of the reaction mixture such as the catalyst and solvent are also continuously charged to the reaction zone either through separate lines or in a single stream. After contact in the reaction zone for a time sufficient to form an impregnating varnish on a suitable reinforcement (prepreg) or the partially cured resin composition, the mixture is continuously withdrawn from the reaction zone and continuously charged to a curing zone wherein it is subjected to a cure by passage through this zone or a multiplicity of zones which are maintained at varying operating temperatures for a predetermined period of time. After passage through these zones, the resulting cross-linked high temperature thermosetting resin composition composite is continuously withdrawn and passed to storage.

Examples of high temperature thermosetting resin compositions which may be prepared according to the process of this invention will include mixtures of styrene, acenaphthylene and glycidyl methacrylate cross-linked with a copolymer of styrene and maleic anhydride; p-bromostyrene, acenaphthylene and glycidyl methacrylate cross-linked with a copolymer of styrene and maleic anhydride; p-chlorostyrene, acenaphthylene and glycidyl methacrylate cross-linked with a copolymer of styrene and maleic anhydride; styrene, acenaphthylene and glycidyl methacrylate cross-linked with a copolymer of acenaphthylene and maleic anhydride; p-bromostyrene, acenaphthylene and glycidyl methacrylate cross-linked with a copolymer of p-bromostyrene and maleic anhydride; p-chlorostyrene, acenaphthylene and glycidyl methacrylate cross-linked with a copolymer of p-chlorostyrene and maleic anhydride; styrene, acenaphthylene and glycidyl methacrylate cross-linked with a copolymer of indene and maleic anhydride; p- bromostyrene, acenaphthylene and glycidyl methacrylate cross-linked with a copolymer of p-bromostyrene and maleic anhydride, p-chlorostyrene, acenaphthylene and glycidyl methacrylate cross-linked with a copolymer of indene and maleic anhydride; styrene, acenaphthylene and glycidyl methacrylate cross-linked with p-iodostyrene and maleic anhydride; p-bromostyrene, acenaphthylene and glycidyl methacrylate cross-linked with a copolymer of o-bromostyrene and maleic anhydride; p-chlorostyrene, acenaphthylene and glycidyl methacrylate cross-linked with a copolymer of acenaphthylene and maleic anhydride; styrene, indene and glycidyl methacrylate cross-linked with a copolymer of indene and maleic anhydride; styrene, indene and glycidyl methacrylate cross-linked with a copolymer of styrene and maleic anhydride; styrene, indene and glycidyl methacrylate cross-linked with a copolymer of acenaphthylene and maleic anhydride; styrene, indene and glycidyl methacrylate cross-linked with a copolymer of p-bromostyrene and maleic anhydride; styrene, acenaphthylene, glycidyl acrylate cross-linked with a copolymer of styrene and maleic anhydride; styrene, acenaphthylene, glycidyl acrylate cross-linked with a copolymer of o-iodostyrene and maleic anhydride; styrene, acenaphthylene, glycidyl acrylate cross-linked with a copolymer of acenaphthylene and maleic anhydride; styrene, acenaphthylene, glycidyl acrylate cross-linked with a copolymer of indene and maleic anhydride; p-bromostyrene, acenaphthylene and glycidyl acrylate cross-linked with a copolymer of p-bromostyrene and maleic anhydride; p-bromostyrene, acenaphthylene and glycidyl acrylate cross-linked with a copolymer of vinyl naphthalene and maleic anhydride; p-bromostyrene, acenaphthylene and glycidyl acrylate cross-linked with a copolymer of indene and maleic anhydride; p-bromostyrene, acenaphthylene and glycidyl acrylate cross-linked with a copolymer of p-iodostyrene and maleic anhydride; etc. It is to be understood that the aforementioned composites are only representative of the class of high temperature thermosetting resin compositions of the present invention and that said invention is not necessarily limited thereto.

The following examples are given for purposes of illustrating the high temperature thermosetting resin compositions of the present invention and to a method for the preparation thereof. However, it is to be understood that these examples are only illustrative in nature and that this invention is not necessarily limited thereto.

EXAMPLE I

A high temperature thermosetting resin composition was prepared by admixing 1 gram of a terpolymer containing 49 mole percent styrene, 28 mole percent acenaphthylene, and 23 mole percent of glycidyl methacrylate with 1.5 grams of an anhydride copolymer containing 75 mole percent of styrene and 25 mole percent of maleic anhydride. The two mixtures were dissolved in 5 ml of N,N-dimethylformamide and 0.2 ml of a catalyst comprising benzyldimethylamine was added. The epoxide and anhydride functionalities were present in a molar ratio of 1:1. The solution was heated to a temperature of 150° C. for a period of from 7 to 9 minutes and coated onto a glass cloth in order to provide a laminating varnish (prepreg). The resulting prepreg was heated in an oven at 170° C. for a period of 78 minutes and thereafter post-cured for a period of 1 hour at 200° C.

It was determined by differential scanning calorimetry (DSC) that the resulting resin composition had a Tg of 213° C. This Tg is evidence of the high degree of cross-linking of the product inasmuch as the Tg of the styrene/acenaphthylene/glycidyl methacrylate terpolymer is 145° C. while the Tg of the styrene/maleic anhydride copolymer curing agent is 143° C. If the resulting product were only a miscible polymer blend, it would be expected that the product would have a single Tg ranging from 143° to 145° C. depending upon the percentage of the terpolymer and copolymer present in the mixture. For example, in the case of the present product in which the molar ratio of epoxide to anhydride is 1:1, it would be expected that the Tg of the product would be 144° C. if only blending had occurred and a single-phase was present.

EXAMPLE II

In this example, 1 gram of an epoxide terpolymer containing 49 mole percent styrene, 28 mole percent of acenaphthylene and 23 mole percent of glycidyl methacrylate was admixed with 1 gram of an anhydride copolymer containing 75 mole percent of styrene and 25 mole percent of maleic anhydride, said mixture being effected in 5 ml of N,N-dimethylformamide. In this example, the molar ratio of epoxide mixture to anhydride mixture was 1:0.75. The mixture was again heated to a temperature of 150° C. for a period of from 7 to 9 minutes and coated onto a glass cloth in order to provide a laminating varnish (prepreg). The prepreg was heated to a temperature of 170° C. and maintained thereat for a period of 78 minutes followed by a post-cure for a period of 1 hour at 200° C.

Analysis of the product by differential scanning calorimetry showed a Tg of 176° C., said Tg being considerably higher than the Tg's of the individual components. In addition, thermomechanical analysis (TMA) showed a softening point of 197° C. and a thermal expansivity (30° to 260° C.) of 85 ppm/°C. The dielectric constant at room temperature, 0% relative humidity, and 1 mHz was 2.57.

We claim as our invention:

1. A high temperature thermosetting resin composition which comprises a terpolymer consisting of (1) an ethylenically monosubstituted unsaturated monomer in which said substituent is an aromatic moiety, (2) an ethylenically alpha, beta-disubstituted unsaturated monomer selected from the group consisting of acenapthalene and idene, and (3) a glycidyl ester of a monoethylenically unsaturated acid, said terpolymer being cross-linked with a cross-linking agent comprising a copolymer of (a) an anhydride of a dibasic olefinic acid and (b) ethylenically monosubstituted unsaturated monomer in which said substituent is an aromatic moiety or an ethylenically alpha, beta-disubstituted unsaturated monomer in which each substituent is an aromatic oy benzylic moiety.

2. The high temperature thermosetting resin as set forth in claim 1 in which said ethylenically monosubstituted unsaturated monomer is selected from the group consisting of styrene, o-chlorostyrene, p-chlorostyrene, o-bromostyrene, p-bromostyrene, o-iodostyrene, 4-methylstyrene, p-iodostyrene and vinyl naphthalene.

3. The high temperature thermosetting resin as set forth in claim 1 in which said glycidyl ester of a monoethylenically unsaturated acid is selected from the group consisting of glycidyl acrylate and glycidyl methacrylate.

4. The high temperature thermosetting resin as set forth in claim 1 in which said cross-linking agent is a copolymer of styrene and maleic anhydride.

5. The high temperature thermosetting resin as set forth in claim 1 in which said cross-linking agent is a copolymer of acenaphthylene and maleic anhydride.

6. The high temperature thermosetting resin as set forth in claim 1 in which said cross-linking agent is a copolymer of p-bromostyrene and maleic anhydride.

7. The high temperature thermosetting resin as set forth in claim 1 in which said terpolymer contains from about 20 to about 75 mole percent of an ethylenically monosubstituted unsaturated monomer in which said substituent is an aromatic moiety.

8. The high temperature thermosetting resin as set forth in claim 1 in which said terpolymer contains from about 20 to about 75 mole percent of an ethylenically alpha,beta-disubstituted unsaturated monomer.

9. The high temperature thermosetting resin as set forth in claim 1 in which said terpolymer contains from about 5 to about 30 mole percent of a glycidyl ester of a monoethylenically unsaturated acid.

10. The high temperature thermosetting resin as set forth in claim 1 in which said anhydride of a dibasic olefinic acid is present in said copolymer in an amount in the range of from about 10 to about 50 mole percent.

11. The high temperature thermosetting resin as set forth in claim 1 in which said terpolymer comprises styrene, acenaphthylene and glycidyl methacrylate and said cross-linking agent comprises a copolymer of styrene and maleic anhydride.

12. The high temperature thermosetting resin as set forth in claim 1 in which said terpolymer comprises p-bromostyrene, acenaphthylene and glycidyl methacrylate and said cross-linking agent comprises a copolymer of styrene and maleic anhydride.

13. The high temperature thermosetting resin as set forth in claim 1 in which said terpolymer comprises styrene, indene and glycidyl acrylate and said cross-linking agent comprises a copolymer of styrene and maleic anhydride.

14. The high temperature thermosetting resin as set forth in claim 1 in which said terpolymer comprises p-chlorostyrene, acenaphthylene, and glycidyl methacrylate and said cross-linking agent comprises a copolymer of acenaphthylene and maleic anhydride.

15. The high temperature thermosetting resin as set forth in claim 1 in which said terpolymer comprises vinyl naphthalene, indene and glycidyl acrylate and said cross-linking agent comprises a copolymer of acenaphthylene and maleic anhydride.

16. A process for the preparation of a high temperature thermosetting resin composition which comprises admixing (1) an ethylenically monosubstituted unsaturated monomer in which said substitutent is an aromatic moiety, (2) an ethylenically alpha, beta-disubstituted unsaturated monomer selected from the group consisting of acenaphthalene and idene, and (3) a glycidyl ester of a monoethylenically unsaturated acid, adding the resultant terpolymer admixture to the copolymer formed by admixing (a) an anhydride of a dibasic olefinic acid and (b) ethylenically monosubstituted unsaturated monomer in which said substituent is an aromatic moiety or an ethylenically alpha, beta-disubstituted unsaturated monomer in which each substituent is an aromatic or benzylic moiety at admixing conditions, cross-linking the terpolymer admixture and copolymer, curing the cross-linked product at curing conditions, and recovering the resultant high temperature thermosetting resin composition.

17. The process as set forth in claim 16 in which said admixing conditions include a temperature in the range of from about ambient to about 100° C. and a pressure in the range of from subatmospheric pressure to atmospheric pressure.

18. The process as set forth in claim 16 in which said curing conditions include a temperature in the range of from about 150° C. to about 250° C. for a period of time ranging from about 1 to about 40 hours.

19. The process as set forth in claim 16 in which said ethylene monosubstituted unsaturated monomer is selected from the group consisting of styrene, pchlorostyrene, p-chlorostyrene, o-bromostyrene, p-bromostyrene, o-iodostyrene, p-iodostyrene and vinyl naphthalene.

20. The process as set forth in claim 16 in which said glycidyl ester of a monoethylenically unsaturated acid is selected from the group consisting of glycidyl acrylate and glycidyl methacrylate.

21. The process as set forth in claim 16 in which said cross-linking agent is a copolymer of styrene and maleic anhydride.

22. The process as set forth in claim 16 in which said cross-linking agent is a copolymer of acenaphthylene and maleic anhydride.

23. The process as set forth in claim 16 further characterized in that said cross-linking is effected in the presence of a catalyst comprising a Lewis base and a solvent system.

24. The process as set forth in claim 16 in which said Lewis base comprises benzyldimethylamine and said solvent system comprises N,N-dimethylformamide.

25. The process as set forth in claim 16 in which said mixture comprises styrene, acenaphthylene and glycidyl methacrylate and said copolymer comprises styrene and maleic anhydride.

26. The process as set forth in claim 16 which said mixture comprises p-bromostyrene, acenaphthylene, and glycidyl methacrylate and said cross-linking agent comprises a copolymer of styrene and maleic anhydride. , 27. The process as set forth in claim 16 in which said mixture comprises styrene, indene and glycidyl acrylate and said cross-linking agent comprises a copolymer of styrene and maleic anhydride.

28. The process as set forth in claim 16 in which said mixture comprises p-chlorostyrene, acenaphthylene and glycidyl methacrylate and said cross-linking agent comprises a copolymer of acenaphthylene and maleic anhydride.

29. The process as set forth in claim 16 which said mixture comprises vinyl naphthalene, indene and glycidyl acrylate and said cross-linking agent comprises a copolymer of acenaphthylene and maleic anhydride.

* * * * *

UNITED STATES PATENT AND TRADEMARK OFFICE
CERTIFICATE OF CORRECTION

PATENT NO. : 4,777,227
DATED : October 11, 1988
INVENTOR(S) : James A. Wrezel and Allyson J. Beuhler It is certified that error appears in the above-identified patent and that said Letters Patent is hereby corrected as shown below:

```
Column 8, line 56:    "oy" should read --or--.
Column 10, line 18:   "ethylene" should read --ethylenically--
Column 10, line 19:   "pchlorostyrene" should read
                      --o-chlorostyrene--;
          line 46:    after "comprise" delete --.--;
          lines 48,49: after "anhydride." delete --,--.
```

Signed and Sealed this

Twentieth Day of February, 1990

*Attest:*

JEFFREY M. SAMUELS

*Attesting Officer*    Acting Commissioner of Patents and Trademarks